United States Patent
Dokumaci et al.

(10) Patent No.: US 7,037,818 B2
(45) Date of Patent: May 2, 2006

(54) APPARATUS AND METHOD FOR STAIRCASE RAISED SOURCE/DRAIN STRUCTURE

(75) Inventors: Omer H. Dokumaci, Wappingers Falls, NY (US); Xinlin Wang, Poughkeepsie, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,080

(22) Filed: Aug. 20, 2004

(65) Prior Publication Data

US 2006/0040484 A1 Feb. 23, 2006

(51) Int. Cl.
*H01L 21/3205* (2006.01)
*H01L 21/4763* (2006.01)

(52) U.S. Cl. .................. 438/595; 438/596; 438/592
(58) Field of Classification Search ................ 439/595; 438/596, 592, 591, 739, 222, 300, 303
See application file for complete search history.

(56) References Cited

U.S. PATENT DOCUMENTS

| | | | |
|---|---|---|---|
| 6,465,842 B1 * | 10/2002 | Nishinohara | 257/330 |
| 6,514,843 B1 | 2/2003 | Dokumaci et al. | |
| 6,686,637 B1 | 2/2004 | Dokumaci et al. | |
| 6,869,866 B1 * | 3/2005 | Chidambarrao et al. | 438/581 |
| 6,872,606 B1 * | 3/2005 | Chen et al. | 438/164 |
| 2002/0063299 A1 * | 5/2002 | Kamata et al. | 257/408 |
| 2003/0107104 A1 * | 6/2003 | Wu et al. | 257/511 |
| 2003/0109105 A1 * | 6/2003 | Mehrotra et al. | 438/278 |

* cited by examiner

*Primary Examiner*—Caridad Everhart
(74) *Attorney, Agent, or Firm*—Joseph P. Abate, Esq.; Greenblum & Bernstein P.L.C.

(57) ABSTRACT

A structure, apparatus and method for improving the performance of semiconductor devices is provided. The semiconductor structure includes a raised source/drain region above a planar source/drain. The raised source/drain has at least a first step and a second step with a variety of transitions therebetween. The first step is of a prescribed height configured to optimize performance of the semiconductor device and is arranged next to a gate. The first step has a top surface above a lower surface of the gate. The second step is arranged next to the first step and has an upper surface raised above the upper surface of the first step. The raised source/drain is configured to reduce resistance with a minimal increase of gate capacitance. The raised source/drain may be fabricated in one deposition step.

19 Claims, 15 Drawing Sheets

APPARATUS AND METHOD FOR STAIRCASE RAISED SOURCE/DRAIN STRUCTURE

BACKGROUND OF INVENTION

The invention relates to semiconductor devices and the fabrication thereof, and more particularly to semiconductor devices and the fabrication thereof for ultra-thin SOI semiconductor devices.

In the design of some semiconductor devices on silicon on insulator (SOI) wafers, and in particular on ultra thin SOI wafers, extension resistance can significantly limit the drive current. The extensions are the region of the semiconductor device which lead to the channel under the gate and generally provide external contact to a portion of the active region of the device.

Methods to reduce extension resistance include raising the source/drain region to reduce the extension resistance. Thus, the volume of conductive material leading away from the channel of the device is increased as well as providing an opportunity to form the raised source/drain regions from a material having a higher conductivity than the source/drain region.

In order to minimize the extension resistance by raising the source/drain region, the raised source/drain region should be arranged to lie close to the edge of the gate. However, if the raised source/drain region is too close to the gate edge, a parasitic capacitance known as gate overlap capacitance can increase significantly. Such gate overlap capacitance may negate any advantages of the raised source/drain region by increasing the total capacitance of the gate thereby curtailing the frequency response of the device.

Embodiments of the invention are directed to solving some or all of the problems discussed above.

SUMMARY OF INVENTION

In a first aspect of the invention, a method comprises fabricating a semiconductor structure, including forming a gate at least partially overlapping at least one extension region. The method also includes forming a first step of material adjacent a side edge of the gate and forming a second step of material raised above the first step and remote from the side edge of the gate in a single material formation process.

In another aspect of the invention, a method of forming a source/drain for a semiconductor device includes forming a first conductive region adjacent a side of a gate, and forming a second conductive region at a height above the first conductive region.

In another aspect of the invention, a structure comprises a semiconductor structure, including a gate arranged to at least partially overlap at least one extension region. The structure also includes a first step raised above a lower surface of the gate; and a second step raised above the first source/drain step.

DETAILED DESCRIPTION

Embodiments of the invention are directed to reducing extension resistance, optimizing the ratio between extension resistance and gate capacitance, and forming a structure to reduce extension resistance in a single fabrication step. For example, an embodiment provides for a reduced extension resistance by arranging a two step raised source/drain structure in an upper portion of the source/drain region. The lower step is proximate the gate and is raised above a lower surface of the gate. The first step may also be referred to as a lower step or lower portion of the raised source/drain structure. The second step is raised above the first step and has the first step disposed between it and the gate structure. The second step may also be referred to as the upper step or upper portion of the raised source/drain structure. The two step source/drain region is formed where the first step is adjacent an extension near a lower surface of the gate. The top surface of the first step is raised above a lower surface of the gate. The two step raised source/drain region also includes a second step where a top surface of the second step is raised above a top surface of the first step.

Another embodiment is directed to optimizing the ratio between reducing extension resistance by providing a raised source/drain structure versus increasing the total capacitance of the gate. By modeling the ratio of current conducted through the device versus the capacitance of the gate for a variety of heights of a first step above a lower surface of the gate, an optimum height of the first step which maximizes the ratio between current and gate capacitance is determined. It has been found that there is an optimum height by which to raise the first step above a lower surface of the gate. This optimum height achieves the best compromise between reducing resistance and increasing gate capacitance, and leads to maximizing the frequency response of the resulting semiconductor device. Thus, by maximizing the current/capacitance ratio, the frequency response of the resulting semiconductor device may be improved.

Another embodiment is directed to reducing extension resistance without a large increase in fabrication complexity by providing two raised steps above a lower surface of the gate in a single fabrication step. In the fabrication process, side wall spacers on the sides of the gate structure are undercut up to an extension under the gate. Next the undercut is filled while a region extending above the undercut is also formed to produce the two raised steps in a single material deposition process.

Figure 1:
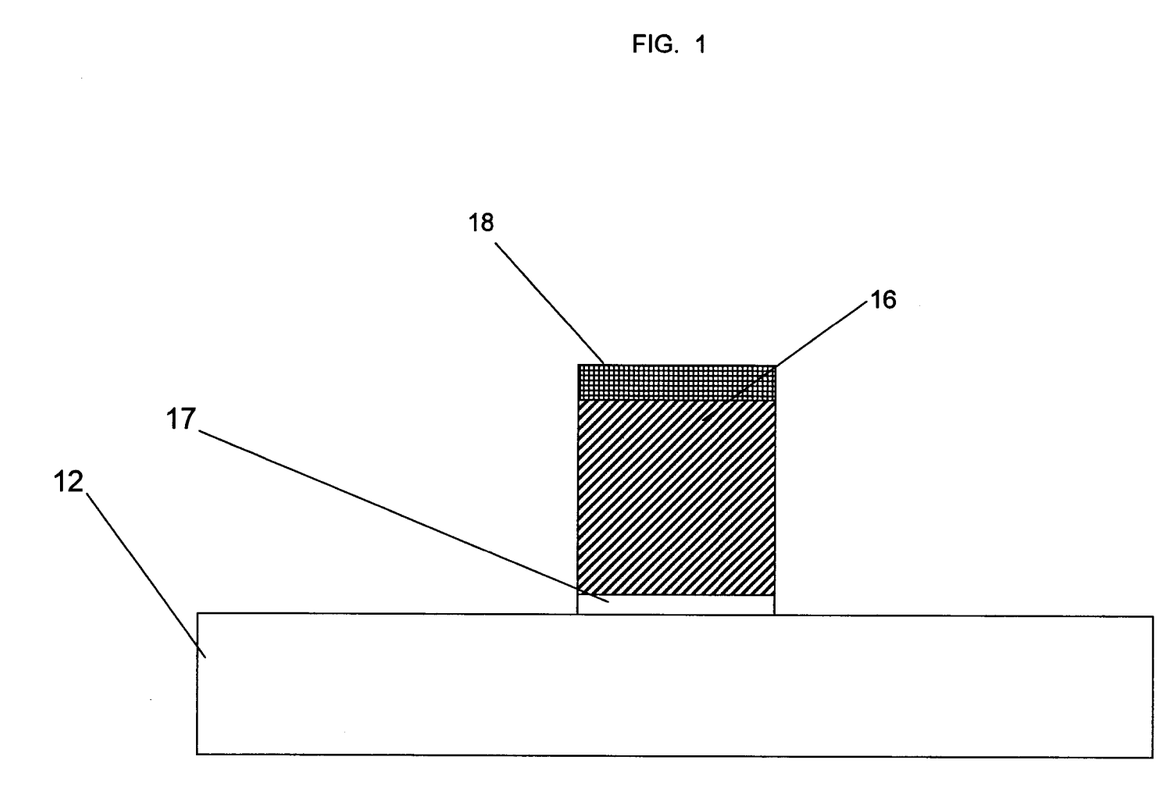
FIGS. 1–9 illustrate steps in manufacturing an embodiment of the invention.

Referring to FIG. 1, a first step in fabricating a semiconductor structure having a raised first and second step source/drain is shown. A substrate 12 has a gate dielectric, such as, for example an oxide layer 17 arranged on its top surface. Arranged on top of the oxide layer 17 is a polysilicon gate 16. The gate may also be a metal gate and may also include an oxide layer on each side of the gate structure formed by deposition of oxide or an oxidation process. The gate dielectric may also include an oxynitride or a high-k dielectric. Disposed on top of the polysilicon gate 16 is a nitride cap 18. Methods for forming each of these layers are well known in the art to those of ordinary skill in the art and are omitted herein.

Figure 2:
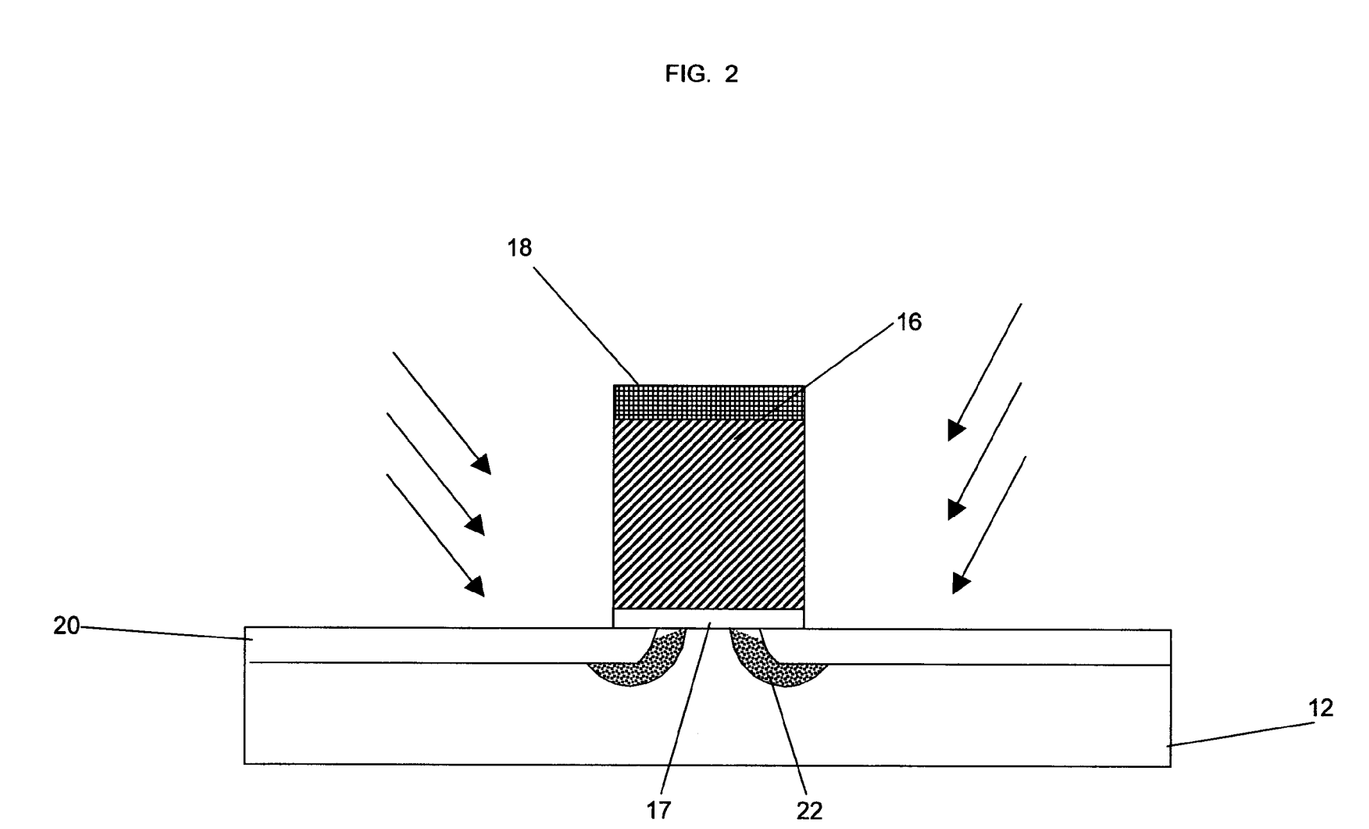

Referring to FIG. 2, extension and halo implants are performed to form a halo region 22 and an extension region 20 in the substrate 12. Typical implant dopants for the extension 20 include arsenic and phosphorous for an nFET type device. Typical dopant energies range from 0.1 KeV–5 KeV. The halo region 22 is formed with p-type dopants and include, for example boron and indium for an nFET device. Typical dopant energies for the halo region 22 range from 1 KeV to 50 KeV, and typical dopant doses range from $10^{13}/cm^2$ to about $10^{14}/cm^2$. The halo implant angle ranges from zero degrees to about forty degrees.

Figure 3:
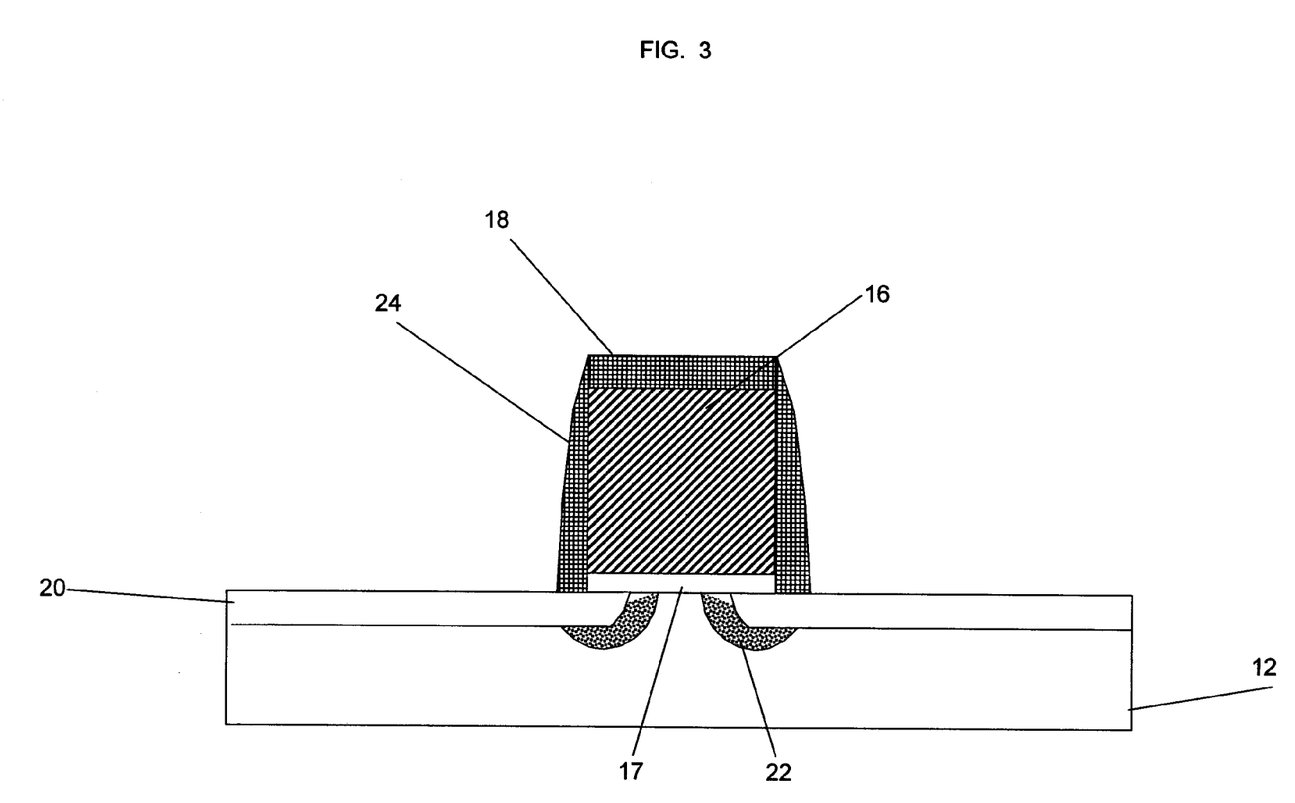

Referring to FIG. 3, a first nitride spacer 24 is formed on sides of the polysilicon gate 16. First nitride spacer 24 extends down the side of the gate 16 to the substrate 12. The first nitride spacer 24 can be deposited by any of the methods well known in the art for depositing nitride spacers including chemical vapor deposition (CVD) and plasma enhanced chemical vapor deposition (PECVD). The nitride spacer 24 is then etched anisotropically to remove the first nitride spacer material from the horizontal surfaces of the substrate 12. Additionally, an optional anneal step may be included before depositing the first nitride spacer 24 to activate the dopants and remove damage from the substrate 12. Thicknesses of the first nitride spacer 24 may typically range between 5 nm to 20 nm.

Figure 4:
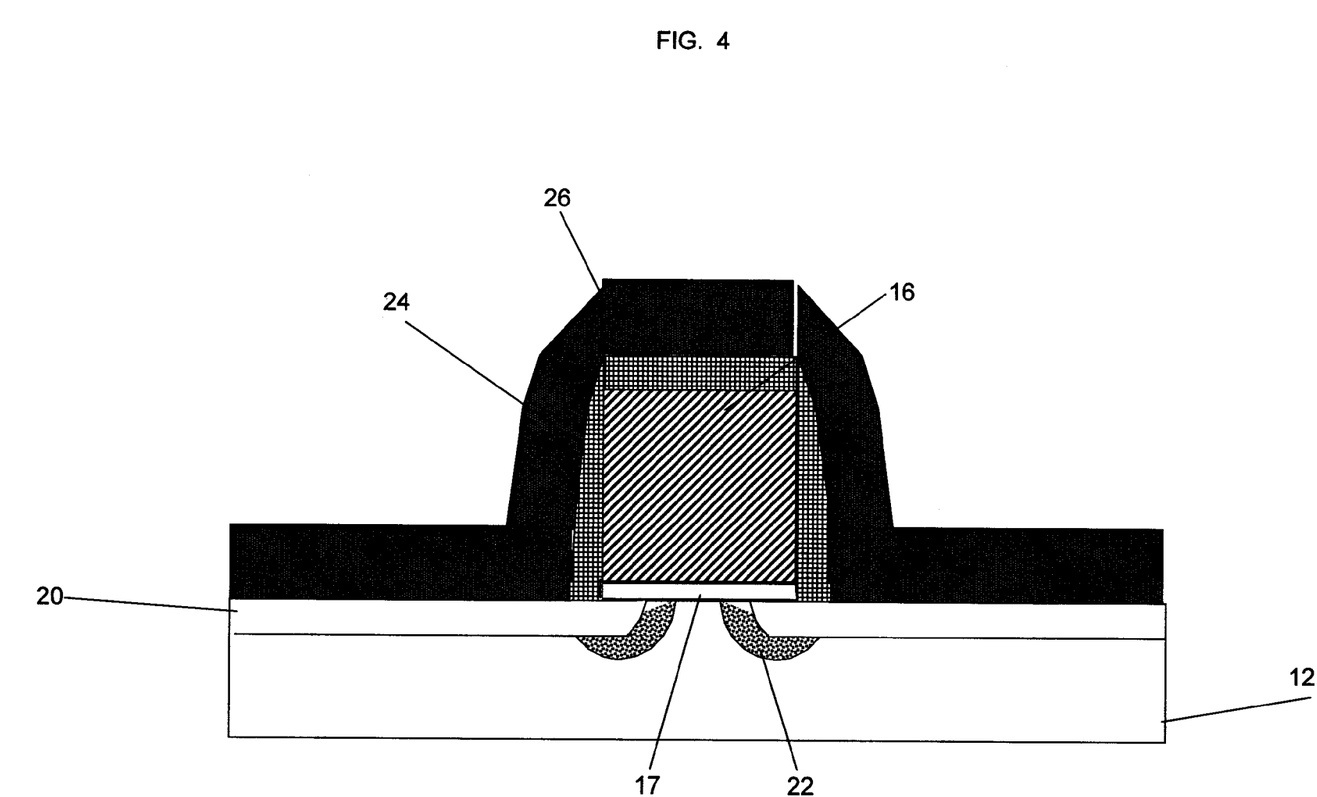

Referring to FIG. 4, a first oxide layer 26 is deposited on the substrate 12, the first nitride spacer 24 and the nitride cap 18. The first oxide layer 26 may be deposited using oxide deposition techniques well known in the art such as tetra-ethyl-ortho-silicate (TEOS), etc. The first oxide layer 26 is typically deposited to a thickness of about 5 nm–20 nm.

Figure 5:
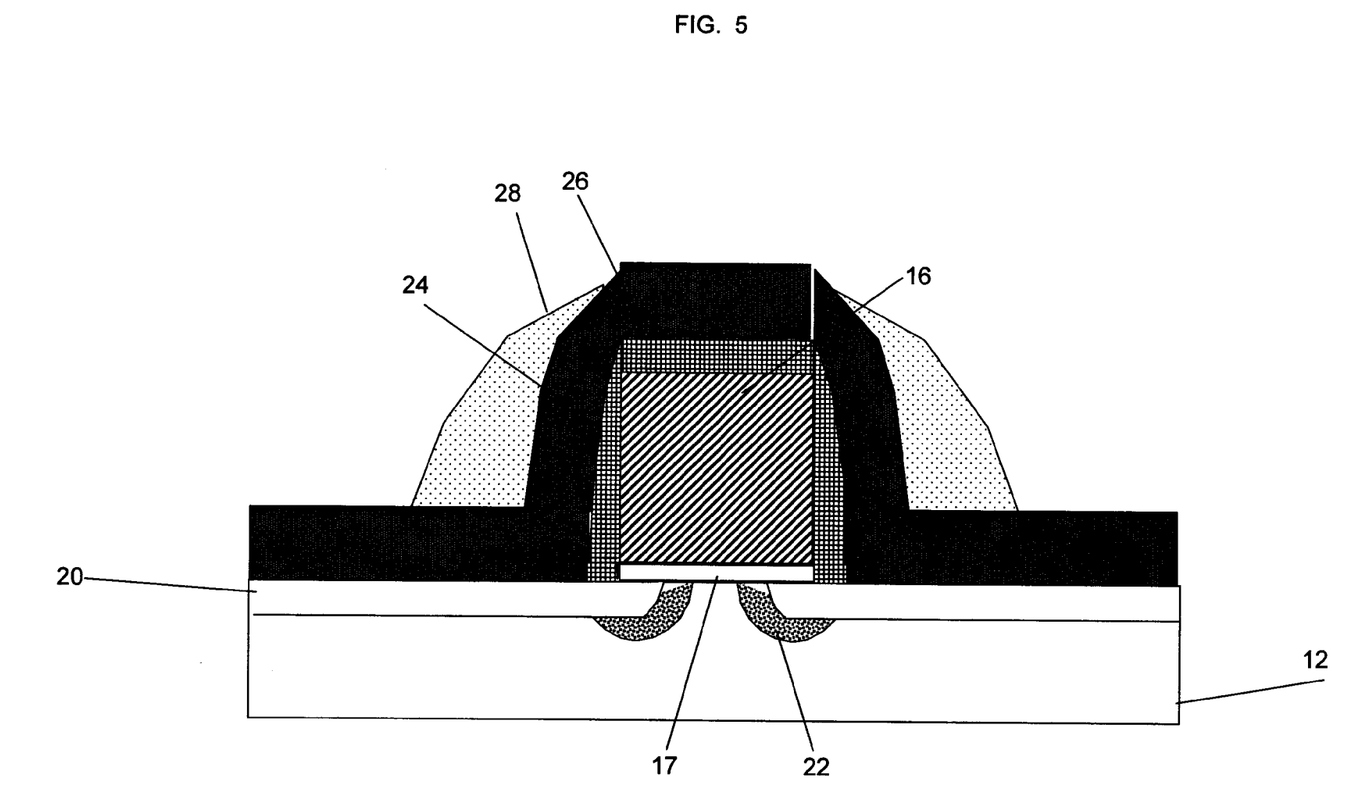

Referring to FIG. 5, a second nitride spacer 28 is formed using methods similar to forming the first nitride spacer 24. For example, the second nitride spacer 28 can be deposited using rapid thermal chemical vapor deposition (RTCVD) or low pressure chemical vapor deposition (LPCVD). After deposition, the second nitride material on the horizontal surfaces is etched away using an anisotropic etch method such as, for example, reactive ion etching (RIE). Thus, the second nitride spacer 28 is formed on the side of the first oxide layer 26, with bottom edges abutting the top of the horizontal portion of the first oxide layer 26.

Figure 6:
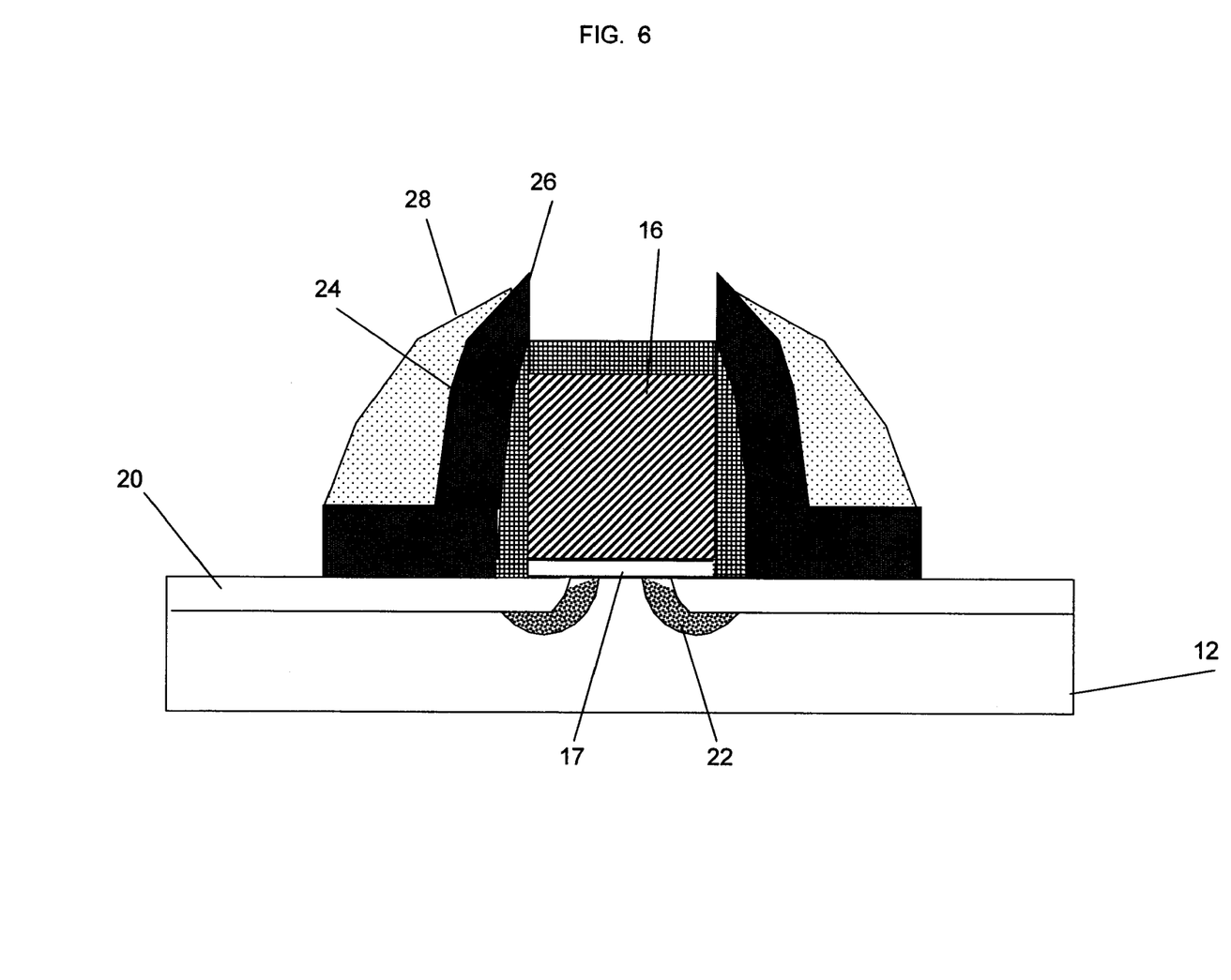

Referring to FIG. 6, an anisotropic etch method is used to remove the exposed portion of the first oxide layer 26 from the horizontal surfaces of the substrate 12 and nitride cap 18. Such oxide etch methods are well known in the art and include, for example, RIE. After the etching process, the edge of the first oxide layer 26 on the substrate 12 is exposed while the horizontal surface of that section of first oxide layer 26 is covered by the second nitride spacer 28.

Figure 7:
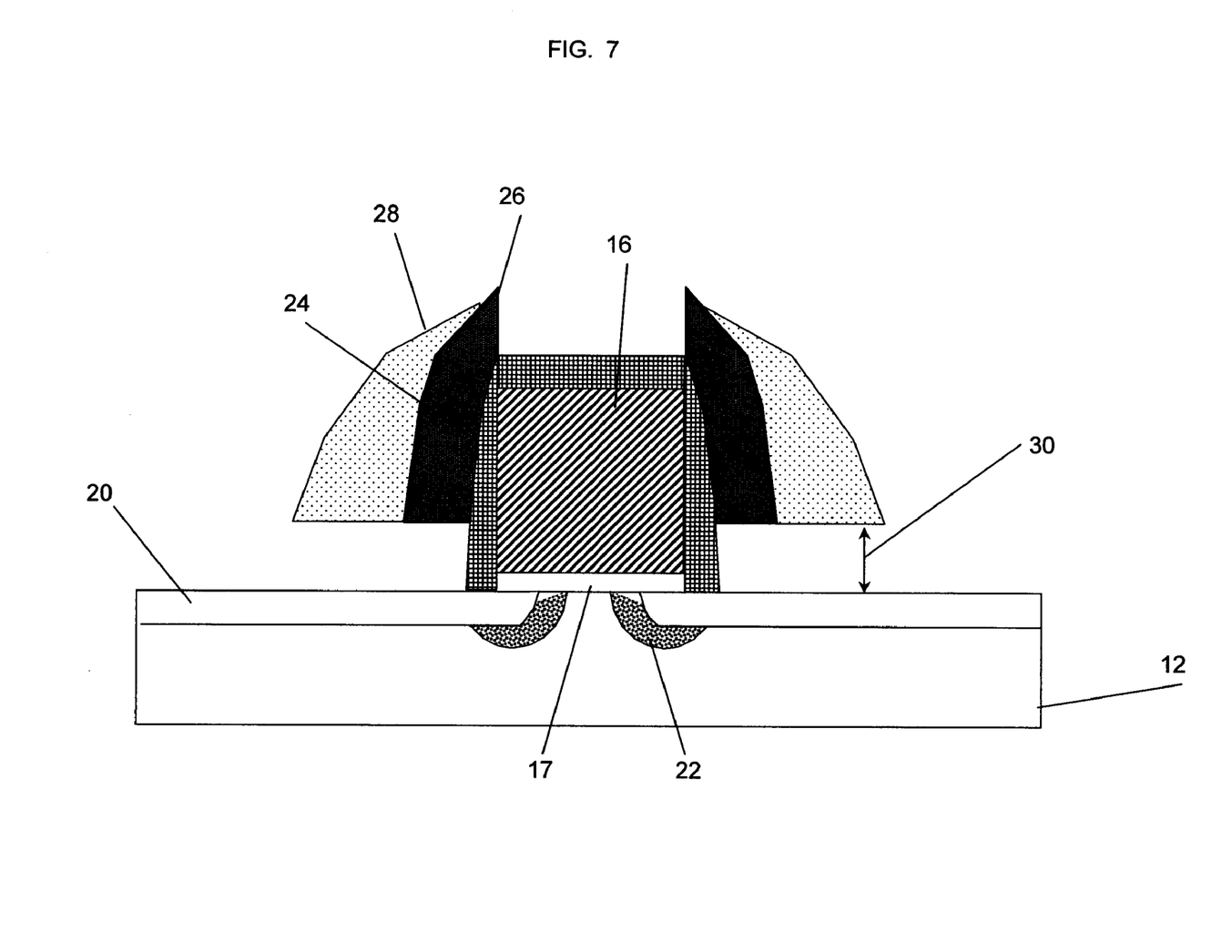

Referring to FIG. 7, the first oxide layer 26 underlying the second nitride spacer 28 is etched using any well known etching process forming an undercut 30. Isotropic etching methods which may be used to form the undercut 30 include a hydrofluoric (HF) etch, for example. The etching process leaves the side edge of the first nitride spacer 24 exposed within the undercut 30. The etching process leaves the undercut 30 with a bottom surface of the second nitride spacer 28 and a bottom surface of the first oxide layer 26 bounding the top of the undercut 30.

Figure 8:
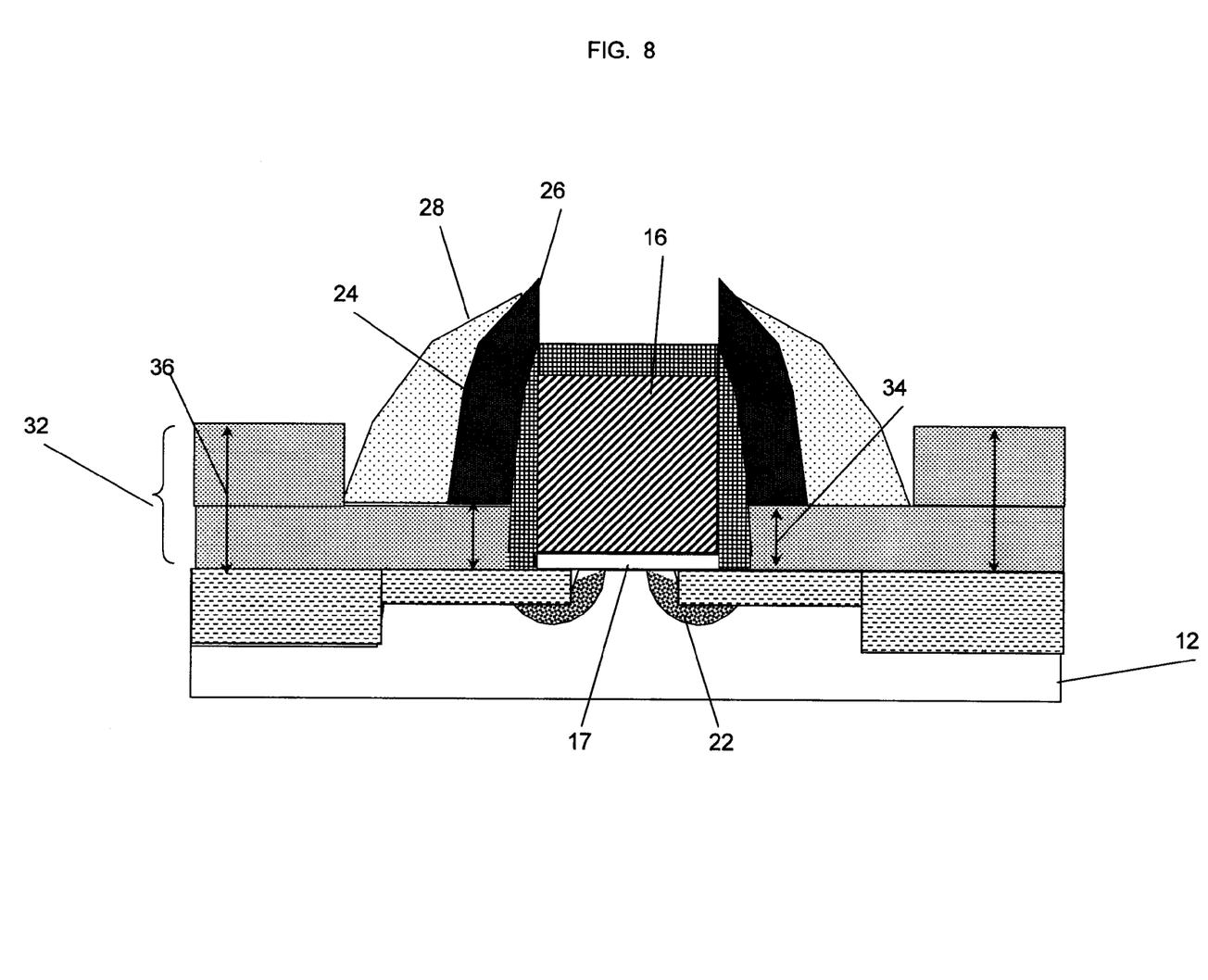

Referring to FIG. 8, a selective epitaxial growth process is used to preferentially deposit silicon in the undercut 30 and extend above the undercut 30 next to the second nitride spacer 28. The selective epitaxial growth process forms a raised source/drain 32. The raised source/drain 32 has a first step 34 and a second step 36. The first step 34 of the raised source/drain 32 occupies the undercut 30.

Accordingly, the first step 34 of the raised source/drain 32 is bounded on top by a lower surface of the second nitride spacer 28 and the first oxide layer 26. The side of the first step 34 closest to polysilicon gate 16 is bounded by a side edge of the first nitride spacer 24. A lower surface of the first step 34 is bounded by the substrate 12. The upper surface of the second step 36 extends above the upper surface of the first step 34. The raised source/drain 32 may be formed using a selective epi growth process using any semiconductor material such as, for example, silicon, silicon germanium (SiGe) and silicon carbon (SiC).

Again referring to FIG. 8, after the raised source/drain 32 is formed, the raised source/drain 32 is implanted with dopants. For example, for an n-type device, dopants include arsenic and phosphorous. Typical dopant energy levels range from 1 KeV–20 KeV. Dopant doses range from about $10^{15}–10^{16}/cm^2$. It should be noted that the source/drain region may or may not extend into the substrate 12. An annealing step is then done. Accordingly, the source/drain includes a raised source/drain 32 having the first and second steps, 34 and 36.

Figure 9:
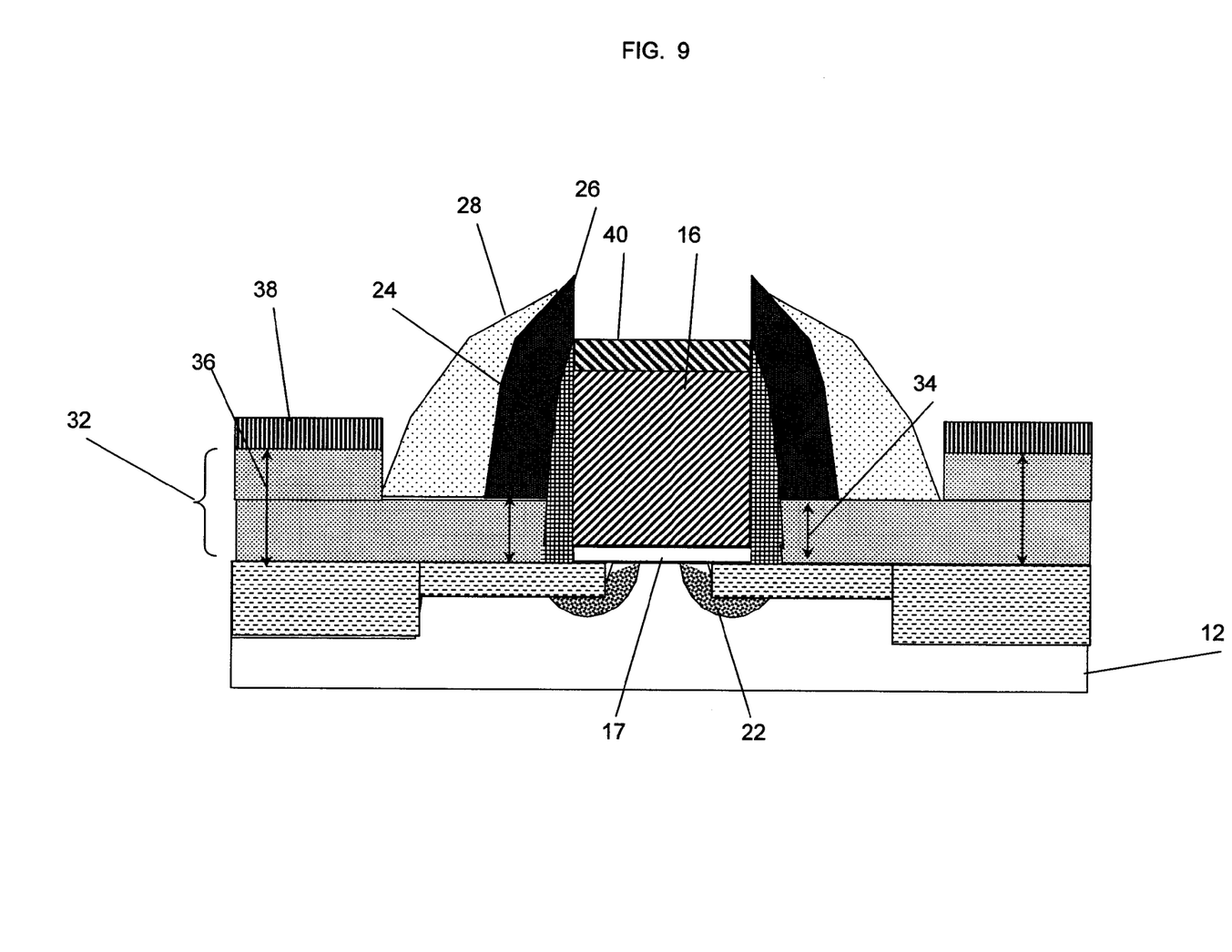

Referring to FIG. 9, after the raised source/drain 32 is doped, the nitride cap 18 on top of the polysilicon gate 16 is removed by any of the standard nitride etching processes well known in the art to expose the top of the polysilicon gate 16. After the top of the polysilicon gate 16 is exposed, a silicide is formed on top of the polysilicon gate 16 to create a gate silicide 40. Additionally, silicide is formed on top surfaces of the second step 36 forming a source/drain suicide 38. Methods used to form the suicide layers are well known in the art and include, for example, depositing a metal on the polysilicon layers and converting the metal to a metal silicide.

As can be seen, due to the increased height of the raised source/drain 32 in the region of the second step 36, there is a thicker doped region underneath the silicide 38 than without the second step 36 and thereby the silicide contact resistance is reduced. After silicide formation, the device is completed by any of the appropriate methods well known in the art.

Referring again to FIG. 9, the completed semiconductor structure is shown having a substrate 12 with a polysilicon gate 16 arranged thereon with a gate oxide 17 disposed therebetween. Each side of the polysilicon gate 16 has a first nitride spacer 24. The first nitride spacer 24 is arranged on a top surface of the extension 20. A raised source/drain 32 has a first step 34 and a second step 36. The top surface of the first step 34 is arranged above a lower surface of the polysilicon gate 16.

Next to the first nitride spacer 24 and arranged above the first step 34 is a first oxide layer 26. Arranged next to the first oxide layer 26 and above the first step 34 is a second nitride spacer 28. The second step 36 of the raised source/drain 32 is raised above an upper surface of the first step 34. The second step 36 has a suicide layer 38 arranged on top of it. Arranged on top of the polysilicon gate 16 is a gate suicide 40. Thus, the total source/drain region of the semiconductor device may be arranged above and within the substrate 12.

While the embodiment of FIG. 9 shows a raised source/drain 32 having a first step 34 and a second step 36, any number of steps may be included in the semiconductor structure and fall within the scope of the invention using the methods described herein. Additionally, while the gate edge of the raised source/drain 32 is of a first height and the outer edge of the source/drain is of a second height, and the transition between the first height and the second height is an abrupt step, any transition type may be used such as, for example, a ranged feature. Accordingly, a raised source/drain may transition from a gate edge having a first height to an outer edge having a second height with a ramp, a curve, a series of small steps, or any other shape which transitions from a first height to a second height.

Figure 10:
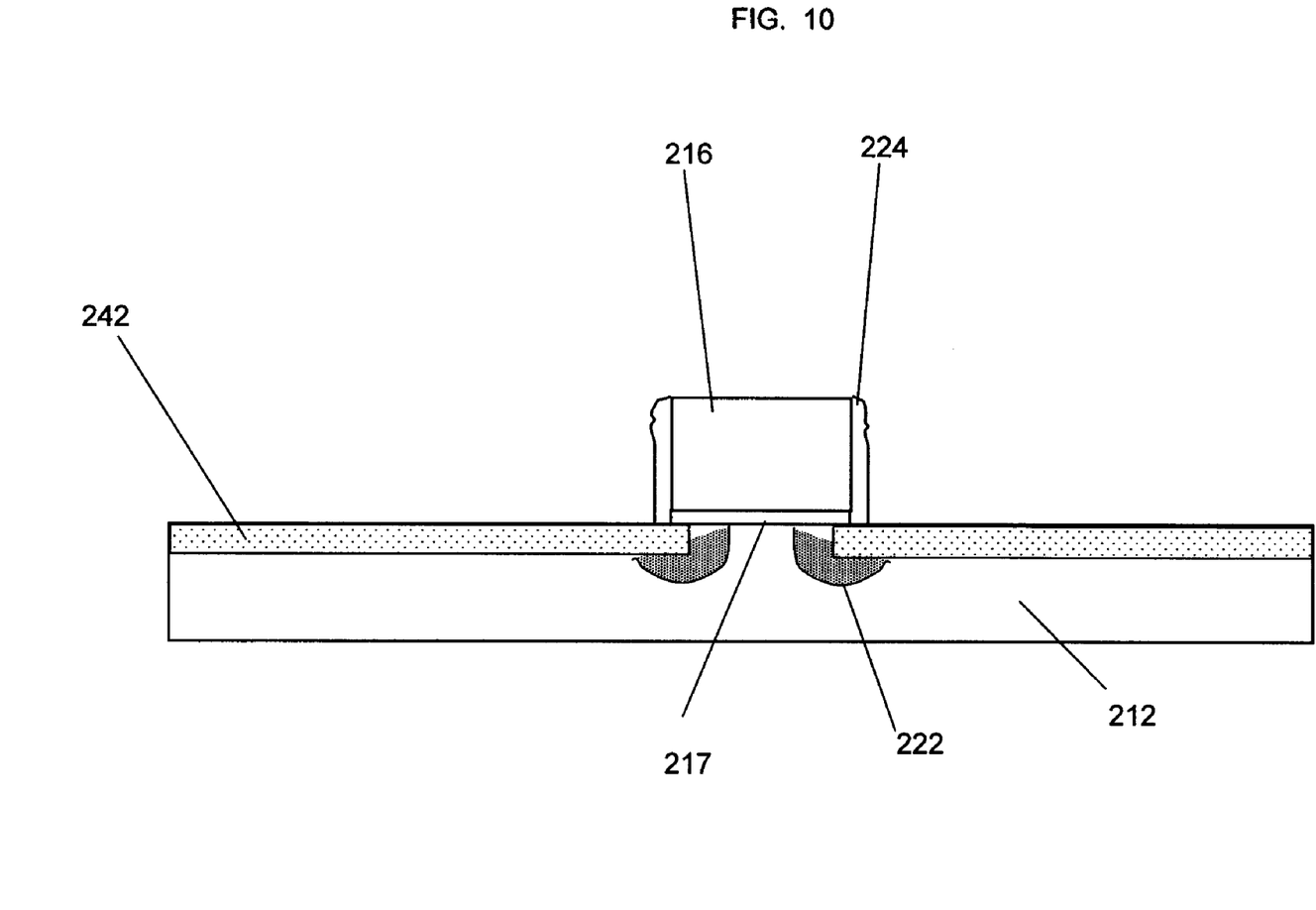
FIGS. 10–13 illustrate steps in manufacturing an embodiment of the invention.

Referring to FIG. 10, a first step in forming another embodiment of the invention is shown. The first step includes using methods well known in the art to form a gate 216 arranged above a substrate 212 with a gate dielectric 217 disposed therebetween. A first nitride spacer 224 is arranged on the side of the gate 216. Dopants are added to the substrate 212 using standard implantation techniques well known in the art to form the halo 222 and source/drain extension 242.

Figure 11:
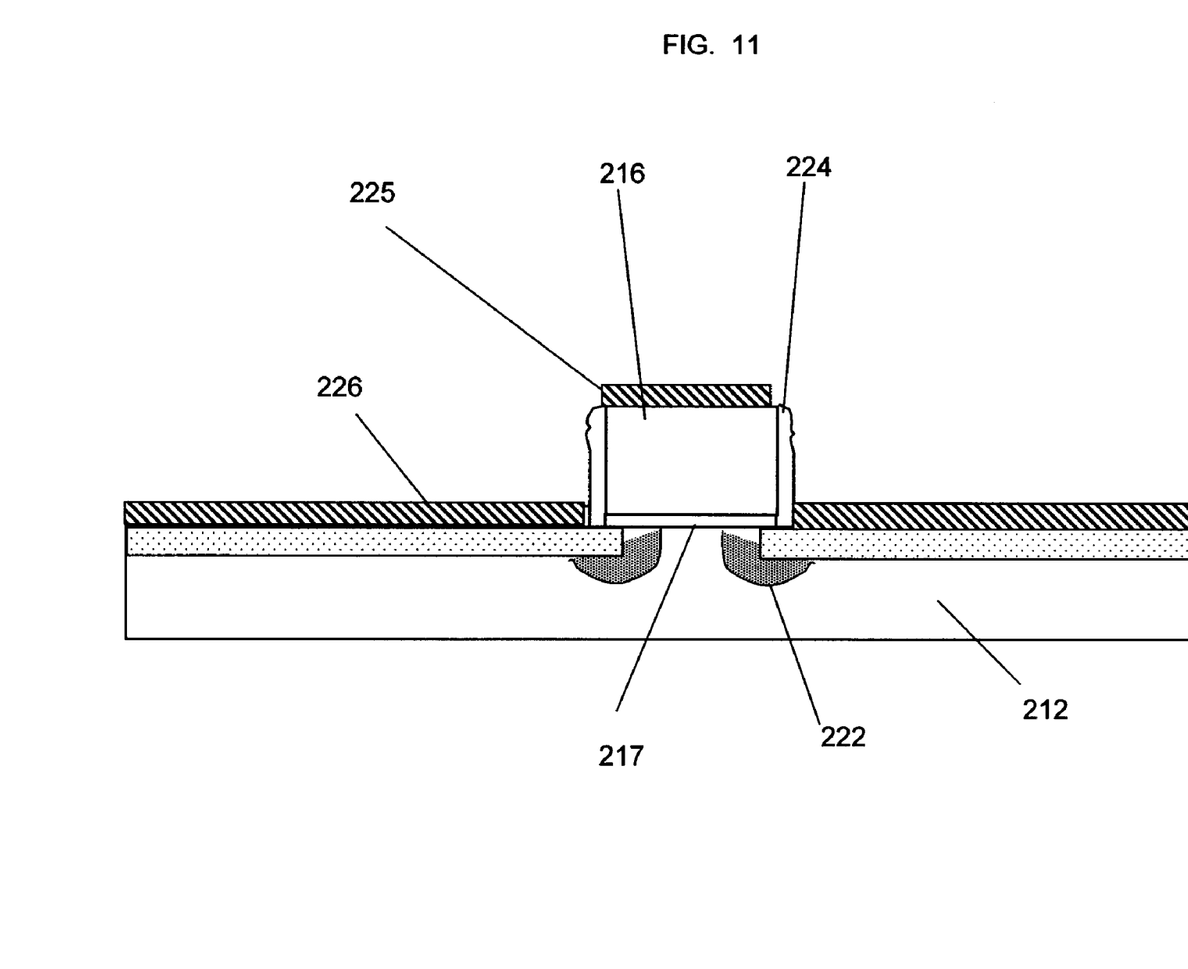

Referring to FIG. 11, an oxide cap 225 is formed on a top of the gate 216 and an oxide layer 226 is formed on top of the substrate 212. The oxide cap 225 and oxide layer 226 may be deposited by high density plasma (HDP) process which preferentially deposits an oxide on a planar surface.

Figure 12:
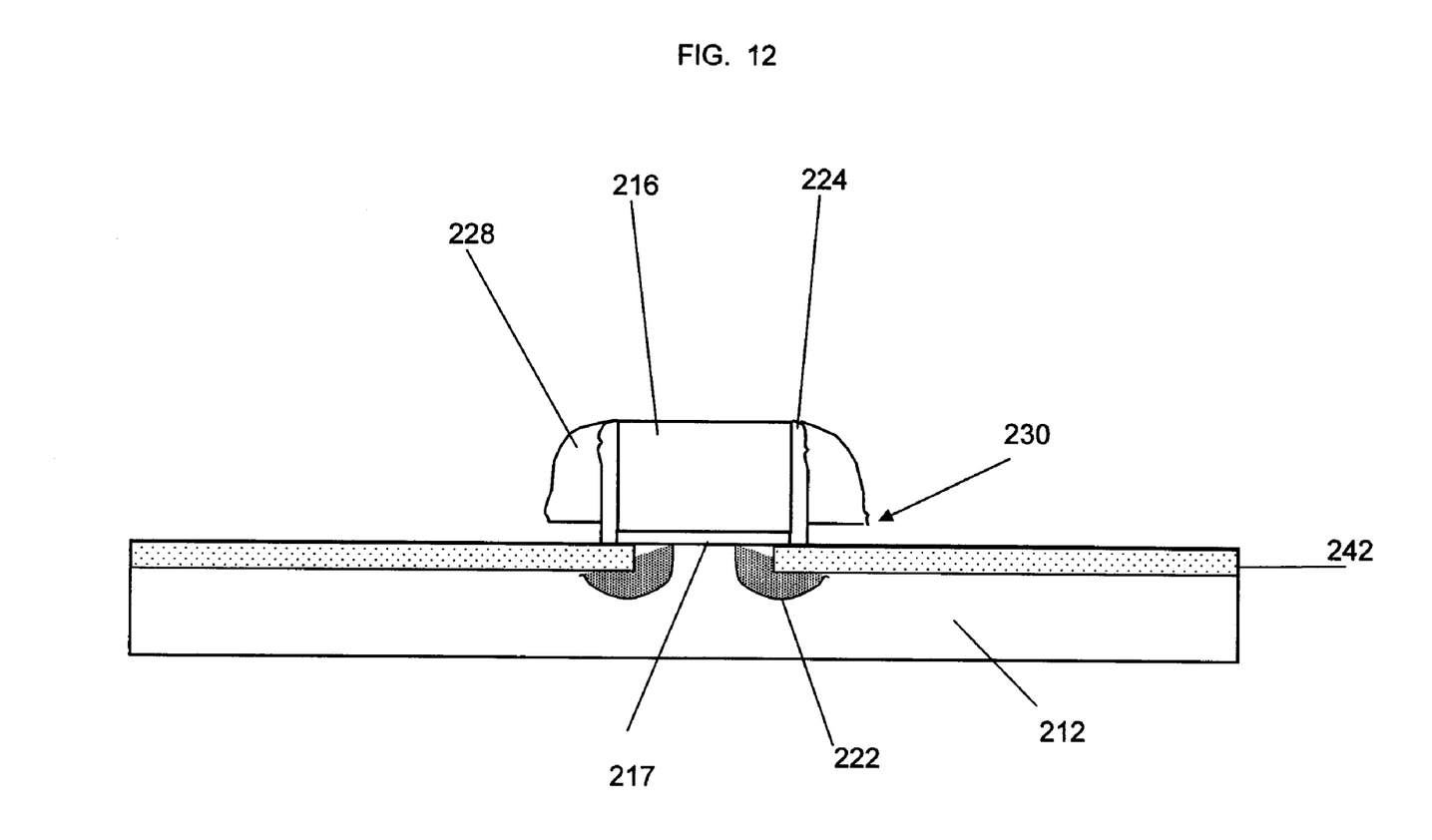

Referring to FIG. 12, a second nitride spacer 228 is formed on a side of the first nitride spacer 224. A wet oxide etch process is then utilized to remove the oxide cap and layer, 225 and 226. Removing the oxide layer 226 leaves an undercut 230 bounded on top by a lower surface of the second nitride spacer 228.

Figure 13:
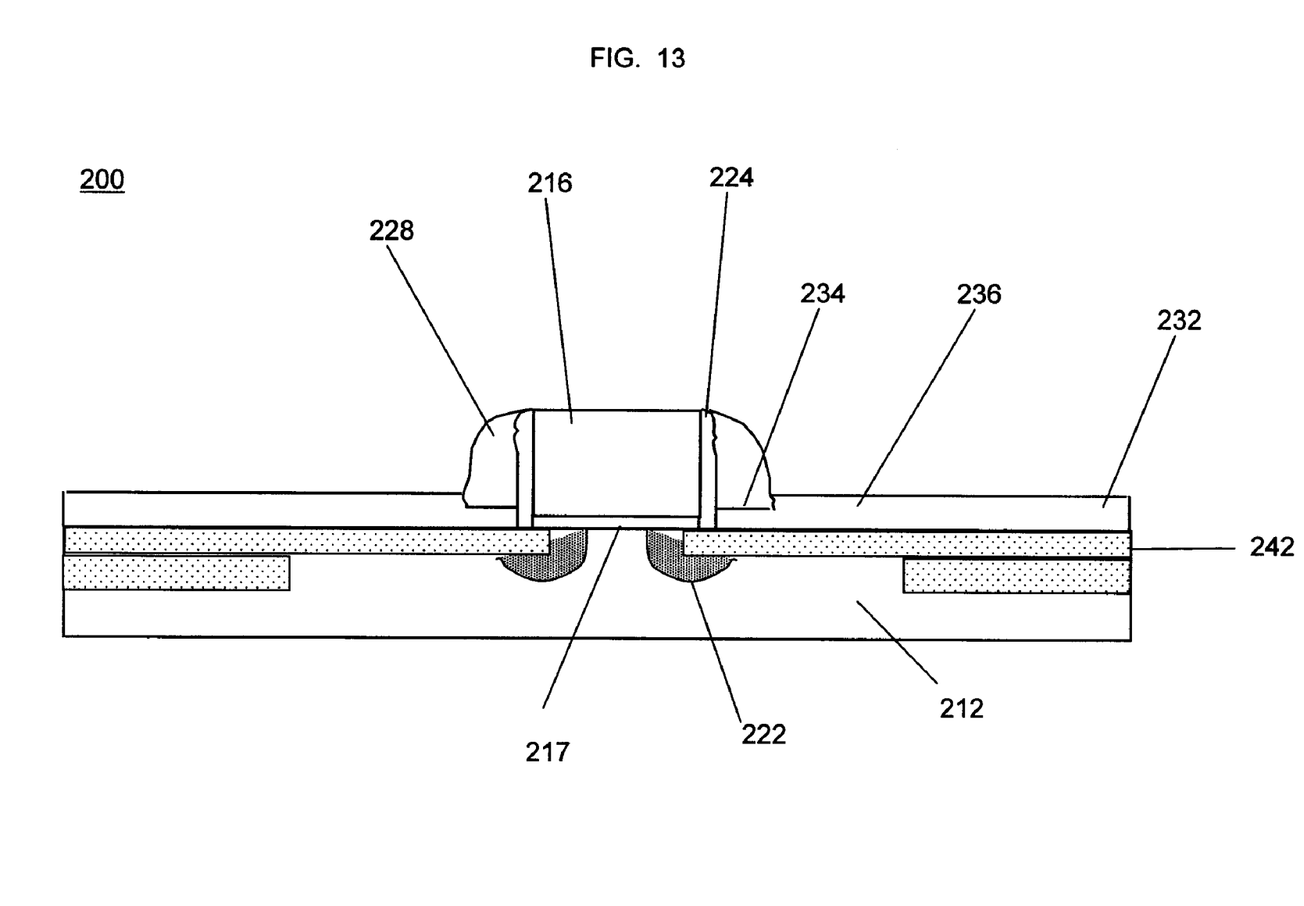

Referring to FIG. 13, a selective epitaxial growth step is used to form semiconductor material such as, silicon, SiGe, or silicon carbide in the undercut 230 and across the surface of the substrate 212 to create raised portion 232. Ion implantation is used to dope the raised portion 232 resulting in a raised source/drain region 232. The implant may extend the source/drain further into the substrate 212. The raised portion region 232 has a first step 234 near the gate 216 and a second step 236 next to and raised higher than the first step 234. Additionally, silicidation and other fabrication steps can be utilized to finish the fabrication process.

The alternate embodiment 200 of the invention is shown having a substrate 212 upon which a raised source/drain 232 is arranged. The raised source/drain 232 has a first step 234 and a second step 236. The semiconductor structure 200 also includes a gate 216 on top of the substrate 212 with a gate oxide 217 disposed therebetween. A first nitride spacer 224 is on the side of the gate 216 and edge of the gate oxide 217. A second nitride spacer 228 is on the side of the first nitride spacer 224.

The first step 234 has an upper surface bounded by a lower surface of the second nitride spacer 228. An upper surface of the first step 234 is above a lower surface of the polysilicon gate 216. The second step 236 of the raised source/drain 232 has an upper surface above the upper surface of the first step 234. It should be noted that while this embodiment of the invention shows two steps, other embodiments may include more than two steps in the raised source/drain and still fall within the scope of the invention. Additionally, the transition between each step may be a step as shown, or a curve, a ramp, etc.

Figure 14:
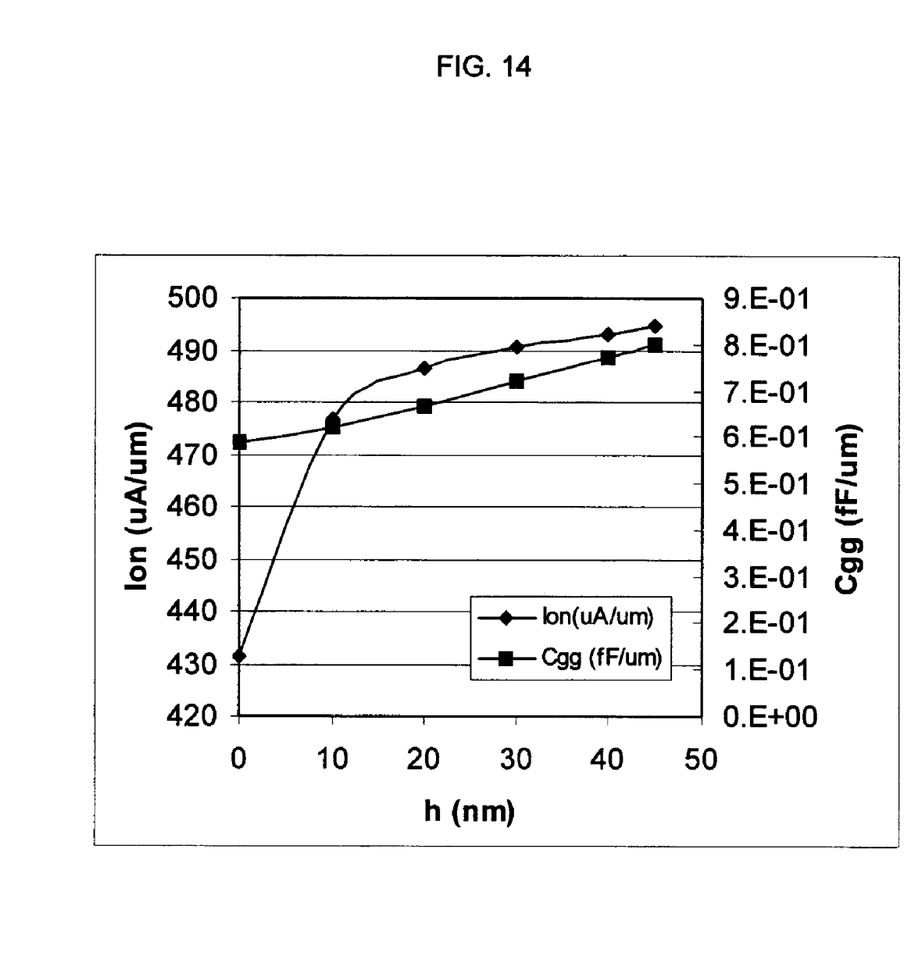
FIG. 14 is a graph of drive current and gate capacitance versus the height of a raised source/drain.

Referring to FIG. 14, a graph illustrating both drive current and gate capacitance of a thin SOI transistor is shown. The line having the diamonds is the drive current, and the line having the squares is the gate capacitance. The x-axis represents a height of a thickness of a raised source/drain step in nanometers (nm). The y-axis shows drive current through the device in microamps per micrometer ($\mu A/\mu m$). The y-axis also shows total gate capacitance in femtofarads per micrometer ($fF/\mu m$). Thus, the y-axis on the left side corresponds to the line showing drive current, and the y-axis on the right side corresponds to the line showing total gate capacitance.

As can be seen, FIG. 14 shows a steady increase in total gate capacitance as the thickness of the first step of the raised source/drain is increased. Additionally, FIG. 14 shows that the drive current also increases as the thickness of the raised first step of the source/drain is increased. However, in contrast to the steady increase seen in gate capacitance, the slope of the drive current abruptly decreases at a height of the raised first step of the source/drain region of about ten nanometers. Thus, drive current quickly increases as the thickness of the raised source/drain is increased up to about 10 nm, and experiences a transition to a diminished increase at a height of the raised source/drain region of about ten nanometers. In contrast, gate capacitance steadily increases through-out the range.

Figure 15:
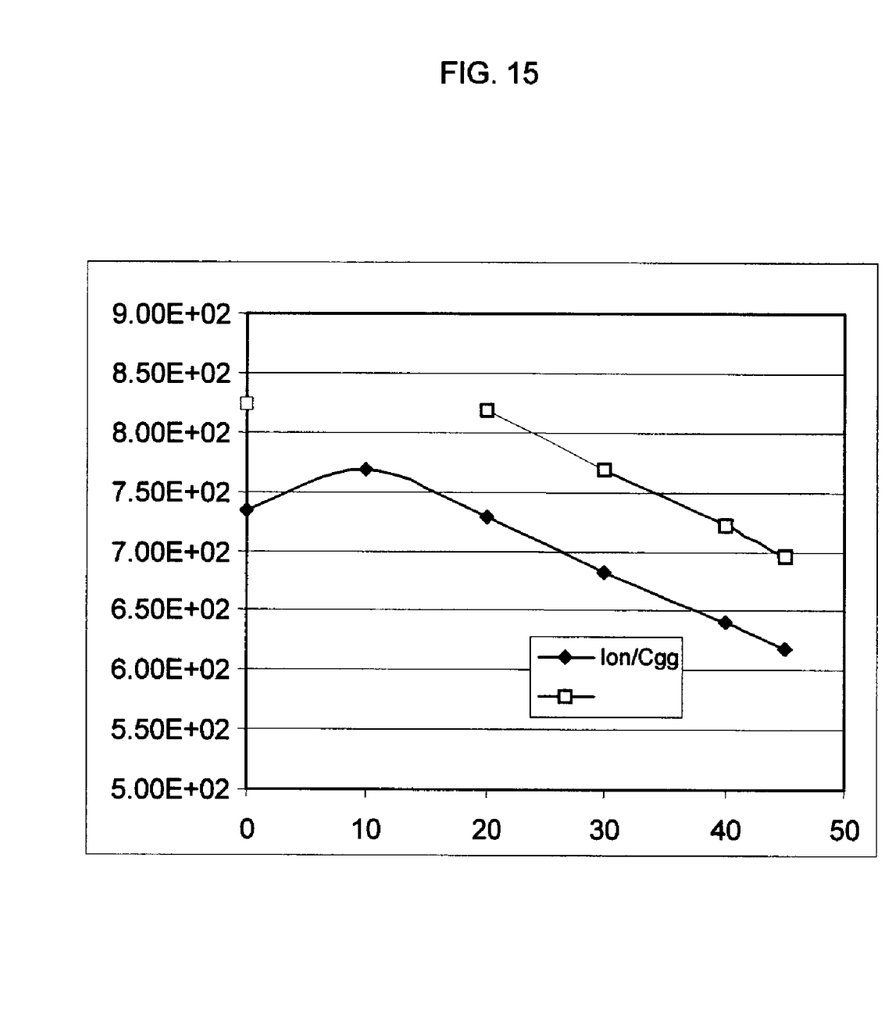
FIG. 15 is a graph of a ratio between drive current and total gate capacitance versus height of a raised source/drain.

Referring to FIG. 15, the ratio between current and gate capacitance is shown. The x-axis of FIG. 15 is the height of the first raised step of the source/drain region in nanometers. The y-axis is the ratio of current to capacitance. Typically, the performance of a semiconductor device is proportional to the current/capacitance ratio. As can be seen from the graph, the current/capacitance ratio of a semiconductor device having a raised step is at a maximum in a region of the height of the raised step of about ten nanometers. Thus, it is advantageous to have the height of a raised step next to the gate of about ten nanometers. However, it should be understood that because it is capacitance with the gate which may be a limiting factor in increasing the height of the step beyond the optimum amount, the height of the step of the source/drain region may be increased beyond the optimum height farther away from the gate with little or no increase in gate capacitance. It may be advantageous to increase the height of the raised step of the source/drain region in order to minimize any suicide contact resistance in a region relatively far away from the gate. Accordingly, a benefit arises, in some implementations for a semiconductor device to have a raised step of about ten nanometers in a region close to the gate, and a higher raised step in a region away from the gate such as, for example, 30 nm, or more.

As discussed above, in order to increase drive current, while minimizing a corresponding increase in gate capacitance, raising the height of the source/drain at an outer edge of the source/drain region more than near the gate is desirable. Accordingly, an embodiment of the invention includes fabricating a raised source/drain having two steps. The first step is close to the gate and is lower than a second step which is far away from the gate.

While the invention has been described in terms of exemplary embodiments, those skilled in the art will recognize that the invention can be practiced with modifications and remain in the spirit and scope of the appended claims.

The invention claimed is:

1. A method of fabricating a semiconductor structure, comprising:

forming a gate at least partially overlapping at least one source/drain region;

forming a first step of material adjacent a side edge of the gate, which is separated from a gate insulation layer beneath the gate, and forming a second step of material raised above the first step and remote from the side edge of the gate in a single material formation process; and forming a silicide on the second step and the gate.

2. The method of claim 1, wherein the first step is electrically connected with a portion of a conductive region arranged underneath the gate.

3. The method of claim 1, wherein the first step is spaced away from the side edge by a spacer.

4. The method of claim 1, wherein the first step and the second step are doped to form a raised source/drain region.

5. The method of claim 1, further comprising depositing sidewalls on the side edge of the gate.

6. The method of claim 5, wherein the second step is formed proximate to the sidewalls and remote from the gate.

7. The method of claim 5, further comprising etching a lower portion of the sidewalls to form an undercut.

8. The method of claim 7, further comprising forming the first step at least partially in the undercut.

9. The method of claim 7, wherein the etching comprises an isotropic etching.

10. The method of claim 9, wherein forming the first step and the second step comprises growing the first step and the second step.

11. A method of forming a source/drain for a semiconductor device, comprising:
    forming a first conductive region on a substrate adjacent a side of a gate, which is separated from a gate dielectric arranged beneath the gate; and
    forming a second conductive region at a height above the first conductive region,
    wherein the first conductive region and the second conductive region are formed in a single growing step.

12. The method of claim 11, further comprising arranging the first and second conductive regions above a third conductive region disposed within a substrate.

13. The method of claim 11, wherein the first conductive region is at a height of approximately 10 nm and the second conductive region is at a height above approximately 30 nm.

14. The method of claim 11, further comprising forming a spacer between a sidewall of the gate and at least a portion of the first conductive region.

15. The method of claim 11, further comprising the steps of:
    forming at least one sidewall adjacent the gate; and
    etching a lower portion of the at least one sidewall to form an undercut,
    wherein the first conductive region is formed at least partially within the undercut.

16. A semiconductor structure, comprising:
    a gate arranged to at least partially overlap at least one source/drain region;
    a first step raised above a lower surface of the gate, which is separated from a gate dielectric layer arranged beneath the gate;
    a second step, formed in a single growing step with the first step, raised above the first step; and
    a conductive layer arranged on a surface of the second step.

17. The structure of claim 16, wherein the first step is approximately 10 nm high.

18. The structure of claim 16, wherein a transition between an edge of the second step and the first step is a shape comprising one of a curved portion, an angled portion, and a stepped feature.

19. The structure of claim 16, further comprising the first step being arranged at least partially under an undercut formed in sidewalls adjacent the gate.

* * * * *